United States Patent
Karthaus

(10) Patent No.: US 8,354,889 B2
(45) Date of Patent: Jan. 15, 2013

(54) POWER AMPLIFIER WITH DYNAMICALLY ADDED SUPPLY VOLTAGES

(75) Inventor: Udo Karthaus, Neu-Ulm (DE)

(73) Assignee: Ubidyne, Inc., Wilmington, DE (US)

( * ) Notice: Subject to any disclaimer, the term of this patent is extended or adjusted under 35 U.S.C. 154(b) by 0 days.

(21) Appl. No.: 13/022,125

(22) Filed: Feb. 7, 2011

(65) Prior Publication Data

US 2012/0200360 A1  Aug. 9, 2012

(51) Int. Cl.
*H03F 3/04* (2006.01)
(52) U.S. Cl. ......................................... 330/297; 330/311
(58) Field of Classification Search .................. 330/285, 330/296, 297, 311
See application file for complete search history.

(56) References Cited

U.S. PATENT DOCUMENTS

| | | | |
|---|---|---|---|
| 4,075,576 A * | 2/1978 | Eden | 330/277 |
| 4,174,503 A * | 11/1979 | Merklinger et al. | 330/300 |
| 6,323,733 B1 | 11/2001 | Gorcea et al. | |
| 6,922,107 B1 | 7/2005 | Green | |
| 7,737,789 B2 * | 6/2010 | Eisenstadt et al. | 330/311 |
| 7,911,279 B2 * | 3/2011 | Chow et al. | 330/311 |
| 8,183,933 B2 * | 5/2012 | Halder et al. | 330/311 |

FOREIGN PATENT DOCUMENTS

GB  2451536  2/2009

* cited by examiner

*Primary Examiner* — Henry Choe
(74) *Attorney, Agent, or Firm* — Stephen H. Eland; Dann, Dorfman, Herrell & Skillman

(57) ABSTRACT

An amplifier for amplifying a radio signal to a defined power output level is presented, wherein the amplifier comprises an amplifier input port, an amplifier output port, a first transistor for amplifying the radio signal received at a first transistor control input, wherein a first transistor output of the first transistor is supplied by a first power source; a at least second transistor for supplying the first transistor from a at least second power supply source. The at least second power supply source is added by the at least second transistor as a function of the power output level of the amplifier.

13 Claims, 4 Drawing Sheets

POWER AMPLIFIER WITH DYNAMICALLY ADDED SUPPLY VOLTAGES

CROSS-REFERENCE TO RELATED APPLICATIONS

None

FIELD OF THE INVENTION

The field of the present disclosure relates in general to an amplifier for amplifying a radio signal used in a mobile communication network and in particular to the power supply of such an amplifier. The field of the invention further relates to a method for amplifying radio signals. The field of the application further relates to a method of manufacturing an amplifier for amplifying a radio signal. The field of the application further relates to a computer program product comprising for causing a computer to manufacture an amplifier for amplifying a radio signal.

BACKGROUND OF THE INVENTION

It is a general requirement to design a radio frequency power amplifier such that the radio frequency power amplifier is highly efficient and is substantially insensitive to load impedance variation and component variation or mismatching load impedances. Power efficiency, for example, is expressed as the power added efficiency (PAE) that takes into account the power $P_{in}$ of an input signal. The power efficiency ratio is defined as the ratio of the difference of the output signal power ($P_{out}$) and input signal power ($P_{in}$) to the DC power consumed:

$$PAE=(P_{out}-P_{in})/P_{DC}=(P_{out}-P_{in})/(V_{DC}*I_{DC})$$

In this formula $V_{DC}$ is the supply voltage of the amplifier and $I_{DC}$ is the consumed supply current of the amplifier.

The power efficiency can be relatively easy optimized for a single specific output level and a specific frequency. However, modern mobile communication networks transmit radio signals at different power levels and at different frequencies in order to improve the overall network interference. In addition to the different power levels the use of efficient modulation schemes leads to relatively high peak-to-average ratios (PAR) of the radio signal. The amplifiers with the high power efficiency for high peak-to-average ratio signals therefore should provide a flat gain versus power characteristic over a wide frequency range.

So far at least two basic approaches are known to tackle the above-mentioned issues. Doherty amplifiers have a relatively simple structure but operate only in a very narrow frequency band and are very sensitive to component variation. It is difficult to tune both load impedances of the Doherty amplifier and it is further difficult to achieve a flat gain versus power characteristic. In contrast, radio frequency amplifiers with envelope tracking cope well with component and load variations. However, the instantaneous bandwidth of the radio frequency amplifier with envelope tracking is too low and switching supply voltages create spurs.

Operators of the mobile communications networks have increased the number of base transceiver stations in order to meet an increased demand for service by users of the mobile communications networks. The operators of the mobile communications network wish to reduce the purchase costs as well as the running costs of the base transceiver stations. Therefore there is a need for radio frequency power amplifiers with high efficiency, in order to reduce the power consumption and at the same time to keep the manufacturing costs for such radio frequency power amplifiers low to be able to sell the radio frequency power amplifiers at prices that are acceptable by the customer.

SUMMARY OF THE INVENTION

It is an aspect of the teachings of the present disclosure to provide an amplifier for amplifying a radio signal to a defined power output level. The amplifier comprises an amplifier input port and an amplifier output port. The amplifier further comprises a first transistor for amplifying the radio signal received at a first transistor control input, wherein a first transistor output of the first transistor is supplied by a first power source. The amplifier further comprises a second transistor for supplying the first transistor with a second power source, wherein the second power supply is dynamically added by the second transistor as a function of the power output level of the amplifier. The amplifier further comprises a capacitor connecting the second transistor output of the at least second transistor with the transistor output of the first transistor. The radio signals have a modulated amplitude with a peak to average ratio (PAR) >>0 dB.

In this aspect of the present disclosure the first power source is sufficient to achieve a desired power level for the amplified radio signals at a relatively low output power compared to the maximum achievable output power. The second transistor is configured such that the second transistor provides an additional power supply to the first transistor for enabling the first transistor to generate larger signal amplitudes of the amplified signal. The power supply of the amplifier is dynamically adapted to the level of power supply that is actually needed to generate a specific output signal amplitude and thus the efficiency of the amplifier is substantially constant over a range of different output power levels. The first capacitor is a short cut for high frequency signals so that the amplified radio signals are not affected by the at least second transistor.

In another aspect of the present disclosure the first power supply source is connected to the first transistor by a first diode. The first diode enables the amplifier to electrically separate the second power source from the first power source so that current from the second power source is blocked from passing to the first power supply source.

In another aspect of the present disclosure a first inductance is connected in series with the first diode. The first inductance serves as a choke for the first transistor. The first inductance allows direct current to pass with little voltage drop whereas the higher impedance for radio frequencies may partly block the amplified radio frequency to pass through the first inductance. The person skilled in the art will appreciate that the inductance may be finite and may be used as part of an impedance matching network to tune the load impedance of the power amplifier.

In another aspect of the present disclosure a second input port of the at least one second transistor is connected to a second bias level source through a second diode. The second diode protects the second transistor against base/emitter break down.

In another aspect of the present disclosure a third diode is inserted between a control input of the second transistor and the emitter of the second transistor. The third diode protects the second transistor against base/emitter break down.

In another aspect of the present disclosure the second power source is passed to the second transistor via a second inductance. In the event that the second transistor is supplying the first transistor with power, the second inductance serves as a choke allowing direct current to pass with little voltage drop while presenting a finite (non-zero) impedance at the radio frequency to allow a certain RF voltage swing across the inductance.

In another aspect of the present disclosure a second input port of the second transistor is connected to a bias level source. By means of the bias level source the level at which the at least second transistor starts to operate is set. The bias voltage has to be chosen in dependence of the properties of the amplifier arrangement such as, but not limited to, the first supply voltage, a first forward voltage of the first diode, a second forward voltage of the second diode, a second base/emitter path of the at least second transistor. In general, a too high bias voltage will lower the efficiency as the second power source delivers power when it is not yet needed and a too low bias voltage will prevent the second power source to deliver power via the at least second transistor and will distort the output signal.

It is another aspect of the teachings of the present disclosure to provide an integrated circuit for an amplifier for amplifying a radio signal to a defined power output level. The amplifier comprises an amplifier input port and an amplifier output port. The amplifier further comprises a first transistor for amplifying the radio signal received at a first transistor control input, wherein a first transistor output of the first transistor is supplied by a first power source. The amplifier further comprises a second transistor for supplying the first transistor with a second power source, wherein the second power supply is dynamically added by the second transistor as a function of the power output level of the amplifier.

It is another aspect of the teachings of the present disclosure to provide a radio station with an amplifier for amplifying a radio signal to a defined power output level. The amplifier comprises an amplifier input port and an amplifier output port. The amplifier further comprises a first transistor for amplifying the radio signal received at a first transistor control input, wherein a first transistor output of the first transistor is supplied by a first power source. The amplifier further comprises a second transistor for supplying the first transistor with a second power source, wherein the second power supply is dynamically added by the second transistor as a function of the power output level of the amplifier.

It is another aspect of the teachings of the present disclosure to provide an active antenna system with an amplifier for amplifying a radio signal to a defined power output level. The amplifier comprises an amplifier input port and an amplifier output port. The amplifier further comprises a first transistor for amplifying the radio signal received at a first transistor control input, wherein a first transistor output of the first transistor is supplied by a first power source. The amplifier further comprises a second transistor for supplying the first transistor with a second power source, wherein the second power supply is dynamically added by the second transistor as a function of the power output level of the amplifier.

It is another aspect of the teachings of the present disclosure to provide a method for amplifying a radio signal to a defined power output level by supplying a first transistor with a first power source and supplying the first transistor from a second power source, wherein the second supply voltage from the second power source is dynamically added by the second transistor as a function of a power output level of the amplified radio signal.

In another aspect of the present disclosure a method for manufacturing an amplifier is disclosed. The method comprises connecting a first transistor control input of a first transistor to an amplifier input port; connecting a second transistor control input of the at least second transistor to a bias voltage terminal; connecting a third diode terminal of a second diode to the first transistor output and connecting a fourth diode terminal to a second transistor source of the at least second transistor; connecting a fifth diode terminal of a third diode to the at least second transistor input of the at least second transistor and connecting a sixth diode terminal to the at least second transistor source; connecting a first capacitor terminal of a capacitor to the second output of the at least second transistor and connecting a second capacitor terminal of the capacitor to the output port of the amplifier.

In another aspect of the present disclosure a computer program product is disclosed. The computer program product comprises a non-transitory computer-usable medium having control logic stored therein for causing a computer to manufacture an amplifier by connecting a first transistor control input of a first transistor to an amplifier input port; connecting a second transistor control input of the at least second transistor to a bias voltage terminal; connecting a third diode terminal of a second diode to the first transistor output and connecting a fourth diode terminal to a second transistor source of the at least second transistor; connecting a fifth diode terminal of a third diode to the at least second transistor input of the at least second transistor and connecting a sixth diode terminal to the at least second transistor source; connecting a first capacitor terminal of a capacitor to the second output of the at least second transistor and connecting a second capacitor terminal of the capacitor to the output port of the amplifier.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
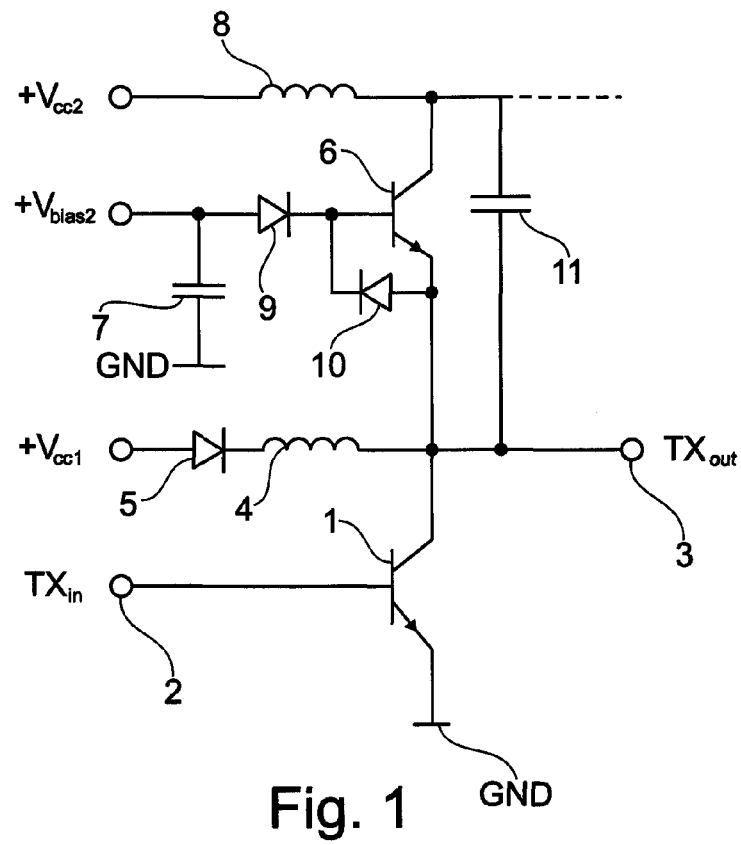
FIG. 1 shows a first aspect of the present disclosure.

FIG. 1 shows an amplifier arrangement for a power amplifier in a radio station. The term "radio station" in intended to cover but is not limited to any stationary radio station such as a so-called base transceiver station in for example a GSM, UMTS or LTE system but also a mobile station, such as a cell phone. The term radio station shall also embrace other applications of radio equipment emitting electromagnetic waves, such as radar equipment or wireless LAN equipment. The amplifier arrangement comprises a first transistor 1 for amplifying a transmit signal $TX_{in}$, received at a power amplifier input terminal 2. The transmit signal $TX_{in}$, may be delivered by a power amplifier driver (shown as element 64 on FIG. 6), the output of which is connected to the power amplifier input terminal 2. In the aspect of the present disclosure the power amplifier is configured as a class AB amplifier. To set the first transistor 1 in class AB mode the power amplifier driver 64 delivers also, in addition to the transmit signal $TX_{in}$ that has to be amplified, a first direct current bias voltage $V_{bias1}$.

The power amplifier terminal 2 is connected to a first base of the first transistor 1. A first emitter of the first transistor 1 is connected to a reference level GND. A collector of the first transistor 1 forms the amplifier output terminal 3 of the amplifier arrangement providing the amplified transmit signal $TX_{out}$. The first collector is further connected to a first inductance terminal of a first inductance 4. A second inductance terminal of the first inductance 4 is connected to a first cathode of a first diode 5. A first anode of the first diode 2 is connected to a first supply voltage $V_{CC1}$ delivered by a first power source (shown as 67 on FIG. 6). The person skilled in the art will appreciate that the order of the first diode 5 and the first inductance 4 may be changed without changing the function of the amplifier arrangement.

A second transistor 6 is connected with a second base to a second cathode of a second diode 9. A second anode of the second diode 9 is connected to a second bias level voltage $V_{bias2}$. The second bias level voltage $V_{bias2}$ may be provided by a voltage divider (not shown) or any other suitable device. A first smoothing capacitor 7 connects the second base of the at least second transistor 6 with a reference level GND. In this manner the second bias level voltage $V_{bias2}$ is buffered against short-term variations of the second bias level voltage $V_{bias2}$.

A second collector of the second transistor 6 is connected to a third inductance terminal of a second inductance 8. A fourth inductance terminal of the second inductance 8 is connected to a second supply voltage $V_{CC2}$ from a second power source (not shown in FIG. 1). A first RF shortcut capacitor 11 connects the second collector of the second transistor 6 to the first collector of the first transistor 1. A second emitter of the second transistor 6 is connected to the first collector of the first transistor 1. A third cathode of the third diode 10 is connected to the second base of the at least second transistor 2. The second diode 9 and the third diode 10 protect a base/emitter path of the second transistor 6 from breakdown.

The person skilled in the art will appreciate that the protection of the second base-emitter path of the second transistor 6 may also be achieved in an alternative way. For example instead of placing the second diode 9 between the second bias level voltage $V_{bias2}$ and the second base of the second transistor, the second diode may be placed between the second emitter of the second transistor 6 and the first collector of the first transistor 1. The protection will perform as well as in the described first alternative, however, in the second alternative with the second diode 9 between the second emitter and the first collector the supply voltage $V_{CC2}$, when it is dynamically added will be subjected to an additional voltage drop between the second anode and the second cathode.

In this aspect of the present disclosure the first transistor 1 is of type NPN. This aspect of the disclosure is applicable to any type of transistors, such as heterojunction bipolar transistors (HBT) and high electron mobility transistors (HEMT) or field effect transistor. The person skilled in the art knows to choose the technology and types of transistors for a specific application. For example as the radio frequency in current mobile communication networks is in a range around 900 MHz to 1.9 GHz the first transistors 1 and the second transistor 6 must satisfy the technical properties of high speed transistors and the power durability necessary to be used in the radio frequency power amplifier.

Figure 2:
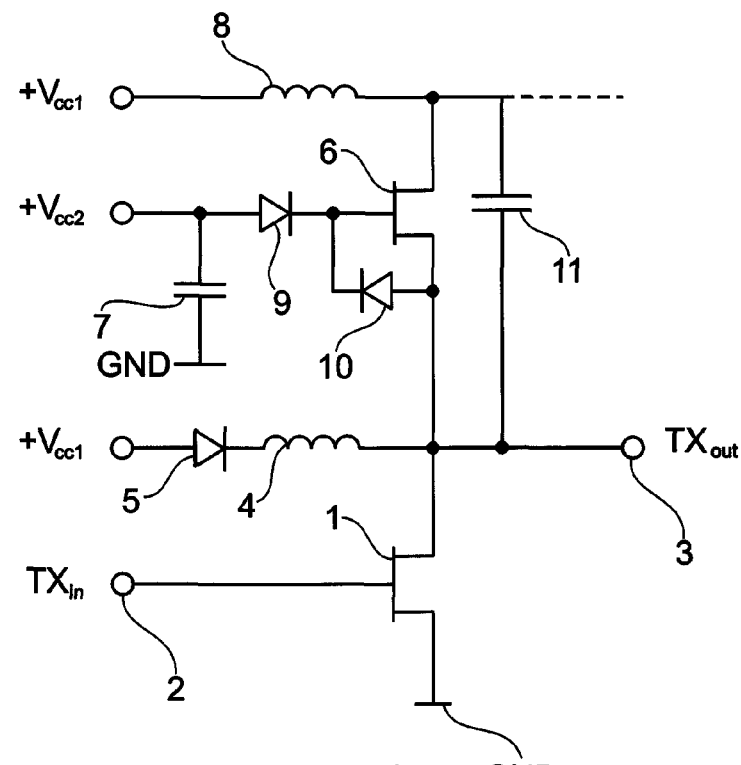
FIG. 2 shows a second aspect of the present disclosure.

FIG. 2 shows another aspect of the present disclosure where a first field effect transistor is chosen for the first transistor 1 and a second field effect transistor is chosen for the second transistor 2. All other circuits are the same as in FIG. 1 and same reference numbers are used to refer to same circuits. In this aspect of the present disclosure the first base of the first transistor 1 of FIG. 1 corresponds to a first gate of the first field effect transistor, the first emitter of the first transistor of FIG. 1 corresponds to a first drain of the first field effect transistor and the first collector of the first transistor 1 of FIG. 1 corresponds to a first source of the first field effect transistor. Similarly the second base of the second transistor 1 of FIG. 1 corresponds to a second gate of the second field effect transistor, the second emitter of the second transistor 6 of FIG. 1 corresponds to a second drain of the second field effect transistor and the second collector of the at least second transistor 1 of FIG. 1 corresponds to a second source of the second field effect transistor. In the following the discussion of the aspect of the present disclosure applies to the aspect of the present disclosure shown in FIG. 1 similarly to the aspect of the present disclosure as shown in FIG. 2.

The power amplifier arrangement of the present disclosure is designed to generate a maximum output power of +37 dBm. For this purpose the first supply voltage has been chosen to be 2.3 Volts and the second supply voltage has been chosen to be 4.0 Volts. The skilled person will appreciate that these values are not limiting the invention as they depend on the used semiconductor technology. For power amplifiers in CMOS technology a supply voltage of even less than 1 Volt for the first supply voltage might be reasonable. In connection with GaN technology the person skilled in the art may chose to have a first supply voltage even higher than 10 Volts appropriate.

The first transistor 1 is operated in this arrangement as a class AB amplifier so that small radio signals are amplified without distortion. For this purpose the power amplifier driver 64 provides a first direct current bias voltage $V_{bias1}$ that sets a direct current operation point of the first transistor 1. In standby mode, e.g. when there is no transmit signal $TX_{in}$ present, the first direct current bias voltage $V_{bias1}$ causes the first transistor 1 to rest in a relatively slightly conducting state. In this phase the voltage at the first collector of the first transistor 1 substantially corresponds to the first supply voltage $V_{CC1}$ minus the forward voltage of the first diode 5, as the direct current resistance of the first inductance is negligible.

In the stand-by mode the voltage at the second emitter of the at least second transistor 6 is substantially at the level of the voltage at the first collector of the first transistor 1. As the voltage at the second base of the second transistor 6 is even lower than the voltage at the second emitter of the second transistor 6, the second base/emitter voltage of the second transistor 6 is negative. The second transistor 6 is in non-conducting state, due to the negative second base/emitter voltage. In the event of a negative second base emitter voltage the third diode is poled in forward direction and limits the second base/emitter voltage of the second transistor 6 thus preventing a base/emitter break down of the at least second transistor 6.

In this aspect of the present disclosure the second transistor will substantially start to conduct if the second base/emitter voltage exceeds 0.5 Volts. Taking into account the second bias voltage $V_{bias2}$ of 1.4 volts, the second forward voltage of 0.2 Volts of the second diode 9 and the third forward voltage of 0.2 Volts of the third diode 10, the second base/emitter voltage exceeds 0.5 Volts, when the voltage at the first collector drops down to 0.5 Volts. However these values are a mere example, as they are technology dependent. The person skilled in the art appreciates that the second bias voltage in case of GaAs HBT will be substantially around 1.2 Volts, for MOS transistors substantially in a range from 0.3 Volts to 0.9 Volts, for SiGe HBT substantially around 0.8 Volts and for HEMTs anywhere between minus or plus a few Volts.

Relatively small input transmit signals $TX_{in}$, at the amplifier input 2 result in also relatively small amplitude variations at the first collector of the first transistor 1. As long as these amplitude variations do not drop the voltage at the first collector to values lower than 0.5 Volts, the second transistor 6 will stay in a non-conducting state. As long as the at least second transistor 6 is in non-conductive state the first transistor 1 draws its supply current exclusively from the first supply voltage $V_{CC1}$. For amplitudes that cause the voltage at the first collector to drop below 0.5 Volts the base/emitter voltage of the second transistor 6 is high enough to set the second transistor 6 in a conductive state. The first transistor 1 draws the supply current then via the second transistor 6 from the second supply voltage $V_{CC2}$. In this phase the first supply voltage $V_{CC1}$ is blocked by the first diode 5. In this manner the first diode 5 separates the first supply voltage VCC1 from the second supply voltage $V_{CC2}$. As soon as the voltage of the first collector of the first transistor 1 returns above 0.5 Volts the second transistor 6 goes back into non-conductive state and the first transistor 1 pulls its supply voltage again from the first supply voltage $V_{CC1}$.

Figure 3:
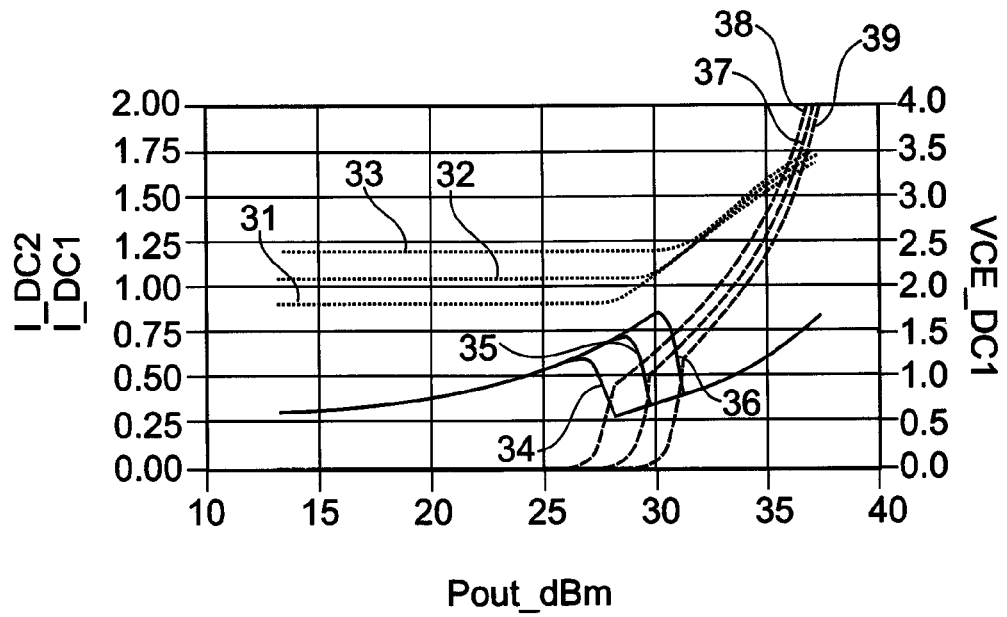
FIG. 3 shows a first diagram relating to an aspect of the present disclosure

FIG. 3 shows results of a simulation carried out by the inventor in which for the first transistor 1 and for the at least second transistor 6 Silicon-Germanium Heterojunction Bipolar Transistors have been chosen. The first diode 5, the second diode 6 and the third diode 10 have been chosen to be ideal diodes with a forward voltage of 0.2 Volts. A first voltage curve 31 shows the direct current voltage at the first collector of the first transistor 1 for a first supply voltage $V_{CC1}$ chosen to be 2.0 Volts corresponding to an almost empty battery; a second voltage curve 32 shows the direct current voltage at the first collector of the first transistor 1 for the first supply voltage $V_{CC1}$ chosen to be 2.3 a Volts for a medium charged battery; and a third voltage curve 33 shows the direct current voltage at the first collector of the first transistor 1 for a first supply voltage chosen as 2.6 Volts for a fully charged battery. Clearly it can be seen that the voltage at the first collector of the first transistor 1 stays constant in the beginning at the level of the chosen first supply voltage minus the forward voltage of the first diode 5. The first voltage curve 31 starts to incline when the output power level exceeds +28 dBm. The second voltage curve 32 starts to incline when the output power level exceeds +29 dBm. The third voltage curve 33 starts to incline when the output power level exceeds +31 dBm.

FIG. 3 also shows the curves of a first main supply current 34 for the first supply voltage chosen to be 2.0 Volts, a second main supply current 35 for the first supply voltage chosen to be 2.3 Volts, and a third main supply current 36 for the first supply voltage chosen to be 2.6 Volts. FIG. 3 further shows the curve of a first additional supply current 37 in the event the first supply is 2.0 Volts, a second additional supply current 38 in the event the second supply voltage is 2.3 Volts, and a third additional supply current 39 in the event the first supply voltage is 2.6 Volts. As the amplifier arrangement is operated in class AB-mode the first transistor 1 in stand-by state is in a slightly conducting mode, consuming a minimum main supply current 34, 35, 36, which is substantially independent from the first supply voltage $V_{CC1}$ of the first power supply source. The first additional supply current curve 37, the second additional supply current curve 38, and the third additional supply current curve 39 clearly show, that in this phase the at least second transistor 6 is in non-conducting state and the additional supply currents (the first additional supply current curve 37, the second additional supply current curve 38, and the third additional supply current curve 39) are zero.

When the input transmit signal $TX_{in}$, is increased the first main supply current 34, the second supply current 35, and the third supply current 36 increase up to a transition point where the second transistor 6 takes over to supply the first transistor 1 from the second power supply source. At the transition point the main supply current (the first main supply current 34, the second main supply current 35, and the third main supply current 36) have reached a first turning point and decline to a second turning point. From this second turning point the main supply current inclines back to substantially the same value at the first turning point. This is the maximum power that the first transistor 1 can pull from the first power supply source. Beyond the turning point the first supply voltage $V_{CC1}$ and the second supply voltage $V_{CC2}$ alternately deliver the main supply current 34, 35. 36 from the first power source and an additional supply current 37, 38, 39 from the second power source in dependence of the actual amplitude of the amplified transmit signal $TX_{out}$.

Figure 4:
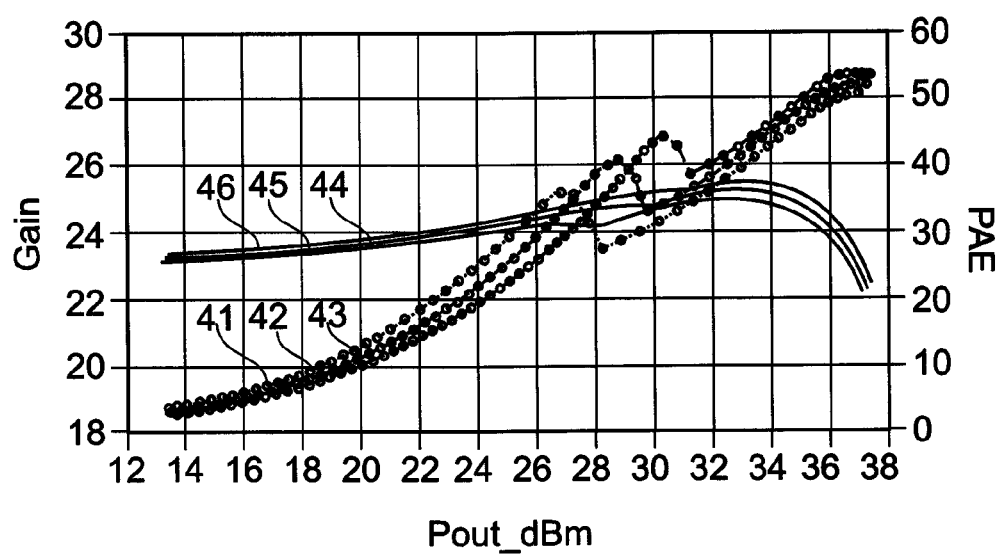
FIG. 4 shows a second diagram relating to a further aspect of the present disclosure

FIG. 4 shows results of a further simulation carried out by the inventor under the same conditions as set out above. A first PAE curve 41, a second PAE curve 42 and a third PAE curve 43 show power added efficiency (PAE) versus output power. The first PAE curve 41 reflects the power added efficiency versus output power for the first supply voltage of 2.0 Volts; the second PAE curve 42 reflects the power added efficiency (PAE) versus output power for the second supply voltage of 2.3 Volts; and the third PAE curve 43 reflects the power added efficiency (PAE) versus output power for the third supply voltage of 2.6 Volts. The transition point where the amplifier arrangement switches from the first supply voltage $V_{CC1}$ to the second supply voltage $V_{CC2}$ can be clearly seen as a drop in the power added efficiency. The output power at which the transition point occurs is determined by the first supply voltage, if all other parameters are kept constant.

In the same diagram of FIG. 4 a first gain curve 44 shows the gain versus output power for the first supply voltage of 2.0 Volts; a second gain curve 45 shows the gain versus output power for the second supply voltage of 2.3 Volts; and a third gain curve 46 shows the gain versus output power for the first supply voltage of 2.6 Volts. The gain curves (44, 45, 46) are reasonable flat. Unlike prior art concepts, such as Doherty amplifiers in which a flat gain versus power output curve has to be achieved by additional circuit elements, the gain versus output power in this aspect of the present disclosure is achieved with a minimum of additional circuit elements. The amplifier arrangement of the aspect of the present disclosure is insensitive to frequency, load, or component variation.

Figure 5:
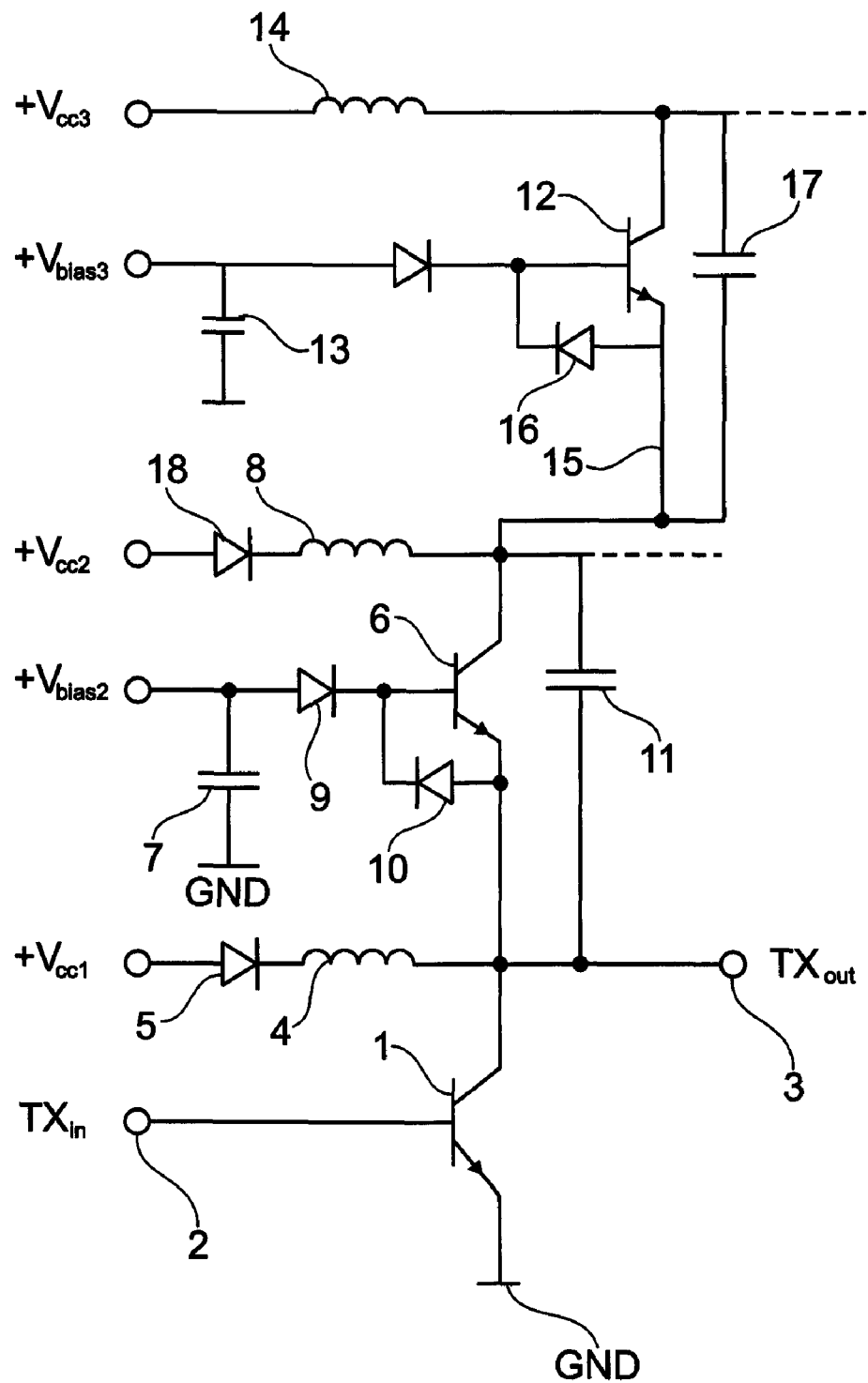
FIG. 5 shows a third aspect of the present disclosure.

FIG. 5 shows as another aspect of the present disclosure an amplifier as discussed before with a third transistor 12 for supplying the first transistor 1 with a third supply voltage $V_{CC3}$. The arrangement shown in FIG. 5 comprises all the elements presented in FIG. 1 of the present disclosure for which the same reference numbers are also used in FIG. 5. In the following disclosure only those components are described that have been added to those components already described in FIG. 1.

A third transistor 12 is connected with a third base to a fifth anode of a fifth diode 15. A fifth cathode of the fifth diode 15 is connected to a third bias level voltage $V_{bias3}$. The third bias level voltage $V_{bias3}$ may be provided by a voltage divider (not shown) or any other suitable device (not shown). A second smoothing capacitor 13 connects the third bias level voltage $V_{bias3}$ with a reference level GND. In this manner the third bias level voltage $V_{bias3}$ is buffered against short-term variations of the third bias level voltage $V_{bias3}$. In order to separate the third supply voltage $V_{CC3}$ from the second supply voltage $V_{CC2}$ a sixth diode 18 is inserted in between the second power supply source $V_{CC2}$ and the second inductance 8. The person skilled in the art will appreciate that the sixth diode 18 may be also inserted between the second inductance 8 and the collector of the second transistor 6 without changing the function of the aspect of the present disclosure.

A third collector of the third transistor 12 is connected to a fifth inductance terminal of a third inductance 14. A sixth inductance terminal of the third inductance 14 is connected to a third supply voltage $V_{CC3}$ from a third power source (not shown in FIG. 5). A third emitter of the third transistor 12 is connected to the second collector of the second transistor 6. A fifth cathode of the fifth diode 16 is connected to the third base of the third transistor 12. The fourth diode 15 and the fifth diode 16 protect a base/emitter path of the third transistor 12 from break down. A second RF shortcut capacitor 17 connects the third collector of the third transistor 12 to the first collector of the first transistor 1. In this aspect of the present disclosure the third supply voltage $V_{CC3}$ is chosen to be 6.0 Volts and the third bias voltage $V_{CC3}$ is chosen to be substantially around 10 Volts. This amplifier arrangement performs identically to the amplifier arrangement described in FIG. 1 as long as the power output level of the amplified transmit signal $TX_{out}$ stays below a second transition point. Due to the third bias voltage $V_{CC3}$ that is higher than the second bias voltage $V_{CC2}$ the third transistor is in a non-conducting state. For very large amplitudes of the amplified transmit signal $TX_{out}$ the voltage at the first collector of the first transistor 1 drops so low, that the third base/emitter voltage of the third transistor 12 is high enough to set the third transistor 12 in a conductive state and the first transistor 1 is supplied from the third power supply source. The third bias voltage in this aspect of the present disclosure has to be chosen such that the third bias voltage corresponds to the base-emitter voltage of the first transistor 1 plus the forward voltage of the second diode 9 plus the knee voltage of the first transistor 1 plus the knee voltage of the second transistor 6, which makes the third bias voltage substantially around 1.9 Volts.

The person skilled in the art will appreciate that the concept of switching between at least two power supply sources for the transmission of radio signals having a modulated amplitude can be extended to any arbitrary number of power supply sources. However, in the event the second and any other additional power source are provided by a voltage regulator, which converts the voltage of a single power source, e.g. by doubling or tripling the voltage of the single power source, the efficiency of the arrangement is limited by the transforming losses of the voltage regulator.

The total efficiency of the transmitter, including the converting losses of the additional power sources therefore depends in which ratio the transmitter transmits in lower power levels and higher power levels. Depending on this ratio the person skilled in the art will decide how many additional supply power sources will be needed to achieve the optimal results.

Figure 6:
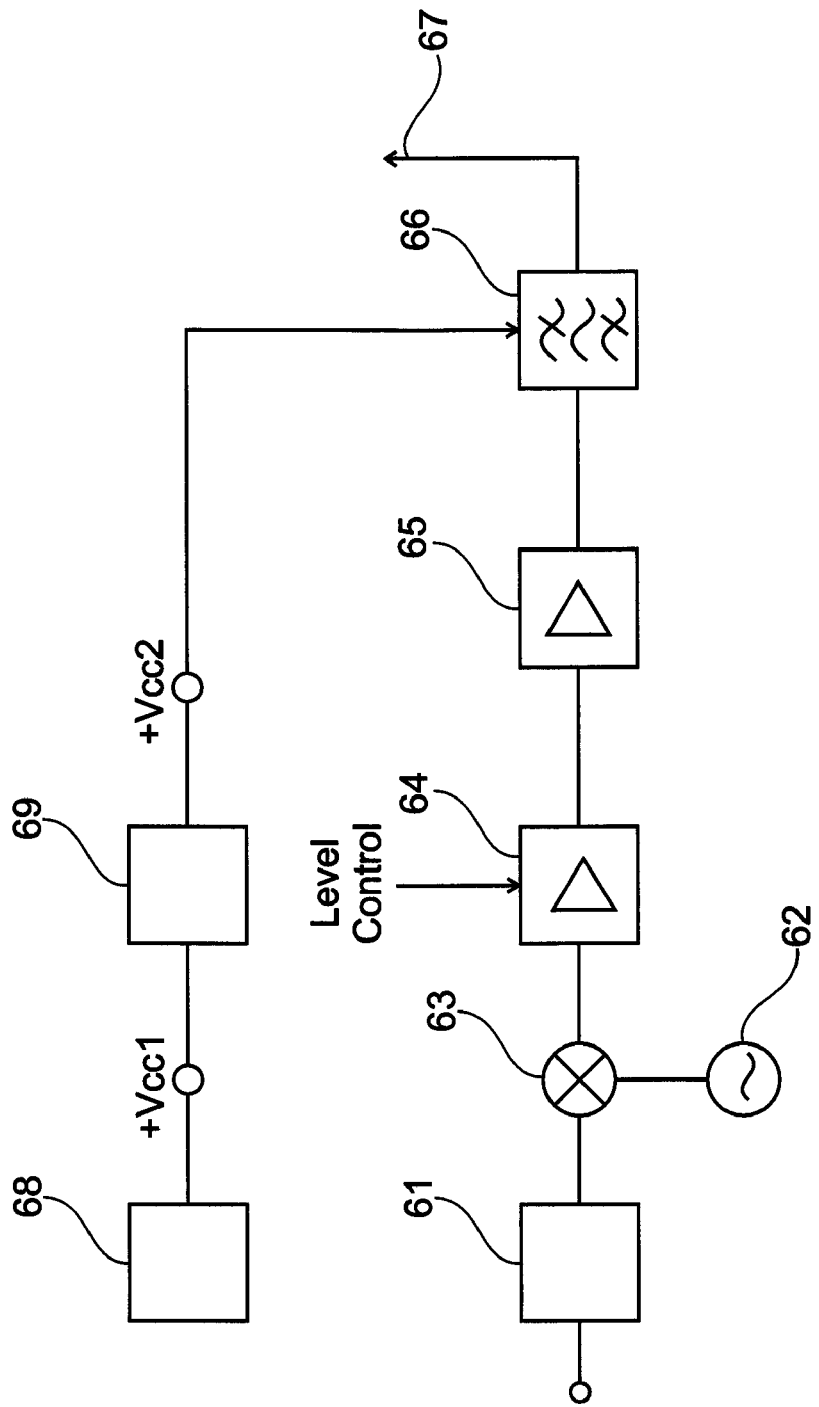
FIG. 6 shows a fourth aspect of the present disclosure.

FIG. 6 shows as another aspect of the present disclosure the use of the amplifier arrangement in a radio station. The radio station may for example be part of an antenna array system for the mobile communications network. As this aspect of the present disclosure relates only to the transmitting part of the radio station, only the transmitting part is shown, although the person skilled in the art will appreciate that the radio station for the mobile communications network will also include circuit arrangements for receiving the radio signal. For reasons of clarity only the most essential components are presented in FIG. 6. In the context of this disclosure the radio station is part but is not limited to a base transceiver station, as known from GSM networks, as well as a node B (known from UMTS/3G networks) or enhanced node B, and similar units used in other mobile communication network.

A base band signal, which comprises encoded data, e.g. encoded voice data, is modulated in an I/Q-modulator 61. The modulated signal is mixed with a radio frequency signal from a synthesized local oscillator 62 in an up-converter 63 and passed to a power amplifier driver 64. The power amplifier driver 64 is controlled by a control signals LEVEL CONTROL to set a defined power level of the amplified transmit signal $TX_{out}$. An output signal of the power amplifier driver 64 is passed to a power amplifier 65 for amplifying the radio signal. The amplified radio signal $TX_{out}$ is passed through a filter 66 to an antenna 67. The power amplifier 65 in this aspect of the present disclosure corresponds to the power amplifier described in FIGS. 1, 2 and/or FIG. 5, respectively. A first power supply source 67 supplies all radio station circuits, e.g. the I/Q-modulator 61, the local oscillator 62, the up-converter 63, the power amplifier driver 64, and the power amplifier 65 with a first supply voltage $V_{CC1}$ of 2.3 Volts. A supply voltage regulator 68, which is also supplied by the first power supply source 67, substantially doubles the voltage of the first supply voltage. In fact, the second supply voltage $V_{CC2}$, generated by the supply voltage regulator 68 is around 4.0 Volts. The second supply voltage $V_{CC2}$ is used, as earlier described, to dynamically supply a second supply voltage to the power amplifier 65 in the event the power amplifier has to provide the amplified transmit signals $TX_{out}$ at a higher output level.

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a central processing unit ("CPU"), micro processor, micro controller, digital signal processor, processor core, system on chip ("SOC") or any other device), implementations may also be embodied in software (e.g. computer readable code, program code, and/or instructions disposed in any form, such as source, object or machine language) disposed for example in a computer useable (e.g. readable) medium configured to store the software. Such software can enable, for example, the function, fabrication, modeling, simulation, description and/or testing of the apparatus and methods describe herein. For example, this can be accomplished through the use of general program languages (e.g., C, C++), hardware description languages (HDL) including Verilog HDL, VHDL, a layout description language (GDS, GDS II, Gerber, . . . ), a circuit description language (Spice) and so on, or other available programs. Such software can be disposed in any known computer useable medium such as semiconductor, magnetic disc, or optical disc (e.g., CD-ROM, DVD-ROM, etc.). The software can also be disposed as a computer data signal embodied in a computer useable (e.g. readable) transmission medium (e.g., carrier wave or any other medium including digital, optical, analogue-based medium). Embodiments of the present invention may include methods of providing the apparatus described herein by providing software describing the apparatus and subsequently transmitting the software as a computer data signal over a communication network including the internet and intranets.

It is understood that the apparatus and method describe herein may be included in a semiconductor intellectual property core, such as a micro processor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. An amplifier for amplifying a radio signal to a defined power output level, the amplifier comprising:
 an amplifier input port:
 an amplifier output port;
 a first transistor for amplifying the radio signal received at a first transistor control input, wherein a first transistor output of the first transistor is supplied by a first power source;
 at least one second transistor for supplying the first transistor from at least a second power supply source, wherein the at least second power supply source is dynamically added as a function of the power output level of the amplifier
 at least a first capacitor connecting a second transistor output of the at least one second transistor with the first transistor output of the first transistor.

2. The amplifier according to claim 1, wherein the first power source is connected to the first transistor by a first diode.

3. The amplifier according to claim 2, wherein a first inductance is connected in series with the first diode.

4. The amplifier according to claim 1, wherein the second power source is connected to the second transistor by a second diode.

5. The amplifier according to claim 4, wherein a second inductance is connected in series with the second diode.

6. The amplifier according to claim 1 wherein a second input port of the at least one second transistor is connected to a second bias level source through a third diode.

7. The amplifier according to claim 1 wherein a fourth diode is inserted between a control input of the at least one second transistor and the emitter of the at least one second transistor.

8. The amplifier according to claim 1 wherein at least one first voltage regulator for up-converting the voltage of the first power supply source forms the at least one second power supply source.

9. The amplifier according to claim 1 wherein at least one first voltage regulator for down-converting the voltage of the second power supply source forms the first power supply source.

10. A method for amplifying a radio signal to a defined power output level,
 supplying a first transistor with a first power source;
 supplying at least one second transistor;
 supplying the first transistor from a second power source, wherein the second supply voltage from the second power source is dynamically added by the second transistor as a function of a power output level of the amplified radio signal,
 connecting, by at least a first capacitor, a second transistor output of the at least one second transistor with the first transistor output of the first transistor.

11. An integrated circuit for an amplifier for amplifying a radio signal to a defined power output level, the amplifier comprising:
 an amplifier input port:
 an amplifier output port;
 a first transistor for amplifying the radio signal received at a first transistor control input, wherein a first transistor output of the first transistor is supplied by a first power source;
 a at least one second transistor for supplying the first transistor from at least a second power supply source, wherein the at least second power supply source is dynamically added by the at least one second transistor as a function of the power output level of the amplifier,
 at least a first capacitor connecting a second transistor output of the at least one second transistor with the first transistor output of the first transistor.

12. A radio station with an amplifier for amplifying a radio signal to a defined power output level, the amplifier comprising:
 an amplifier input port:
 an amplifier output port;
 a first transistor for amplifying the radio signal received at a first transistor control input, wherein a first transistor output of the first transistor is supplied by a first power source;
 a at least one second transistor for supplying the first transistor from at least a second power supply source, wherein the at least second power supply source is dynamically added by the at least one second transistor as a function of the power output level of the amplifier,
 at least a first capacitor connecting a second transistor output of the at least one second transistor with the first transistor output of the first transistor.

13. An active antenna system with an amplifier for amplifying a radio signal to a defined power output level, the amplifier comprising:
 an amplifier input port:
 an amplifier output port;
 a first transistor for amplifying the radio signal received at a first transistor control input, wherein a first transistor output of the first transistor is supplied by a first power source;
 a at least one second transistor for supplying the first transistor from at least a second power supply source, wherein the at least second power supply source is dynamically added by the at least one second transistor as a function of the power output level of the amplifier,
 at least a first capacitor connecting a second transistor output of the at least one second transistor with the first transistor output of the first transistor.

* * * * *